United States Patent [19]
Walen et al.

[11] Patent Number: 5,295,838
[45] Date of Patent: Mar. 22, 1994

[54] RAISED FEATURE/GOLD DOT PRESSURE INTERCONNECTIONS OF RIGID-FLEX CIRCUITS AND RIGID CIRCUIT BOARDS

[75] Inventors: James R. Walen, Mission Viejo; Robert E. Daugherty; Kenneth G. Given, II, both of Irvine, all of Calif.

[73] Assignee: Hughes Aircraft Company, Los Angeles, Calif.

[21] Appl. No.: 4,737

[22] Filed: Jan. 14, 1993

[51] Int. Cl.$^5$ .................... H01R 23/66; H01R 23/68
[52] U.S. Cl. ........................ 439/67; 439/493
[58] Field of Search ................. 439/67, 493, 77

[56] References Cited

U.S. PATENT DOCUMENTS

| | | | |
|---|---|---|---|
| 4,125,310 | 11/1978 | Reardon, II et al. | 439/329 |
| 4,453,795 | 6/1984 | Moulin | 439/361 |
| 4,489,999 | 12/1984 | Miniet | 439/77 |
| 4,711,548 | 12/1987 | Arakawa et al. | 439/66 |
| 4,871,315 | 10/1989 | Noschese | 439/77 |
| 5,095,628 | 3/1992 | McKenney et al. | 439/67 |
| 5,197,184 | 3/1993 | Crumly et al. | 29/846 |
| 5,207,887 | 5/1993 | Crumly et al. | 205/78 |

Primary Examiner—Gary F. Paumen
Attorney, Agent, or Firm—Elizabeth E. Leitereg; Terje Gudmestad; Wanda K. Denson-Low

[57] ABSTRACT

A multi-layer rigid-flex circuit (20) is formed of a number of flexible layers (62–70) on a rigid substrate (100) with individuals ones of the layers having laterally projecting arms (32,38) that define flexible circuit connections to individual ones of a number of ceramic circuit boards (10,12,14,16). The laterally projecting flexible arms (32,34,36,38) are each formed with gold dot or projecting feature pressure contacts (40a–40g) which are pressed against mating sets of circuit board contact pads (40a–40g) by a clamping bar (120) that is bolted to the rigid circuit board. Thus the interconnections between the rigid-flex circuit and the circuit boards are effectively built into the rigid-flex circuit, requiring only a clamp to complete the connection.

16 Claims, 2 Drawing Sheets

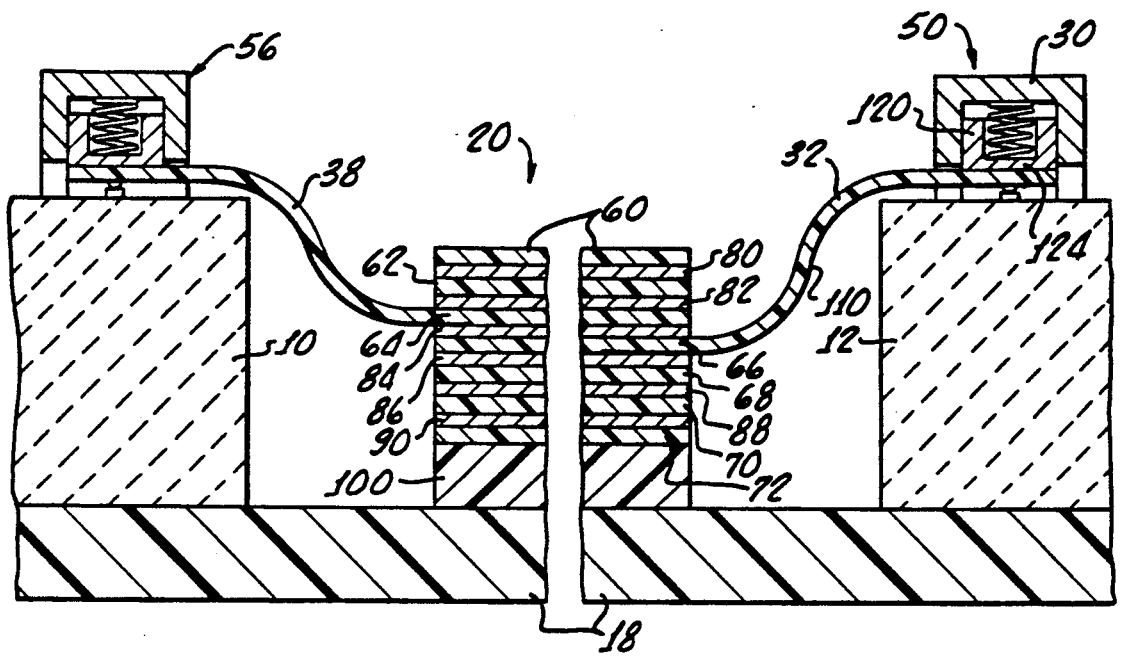
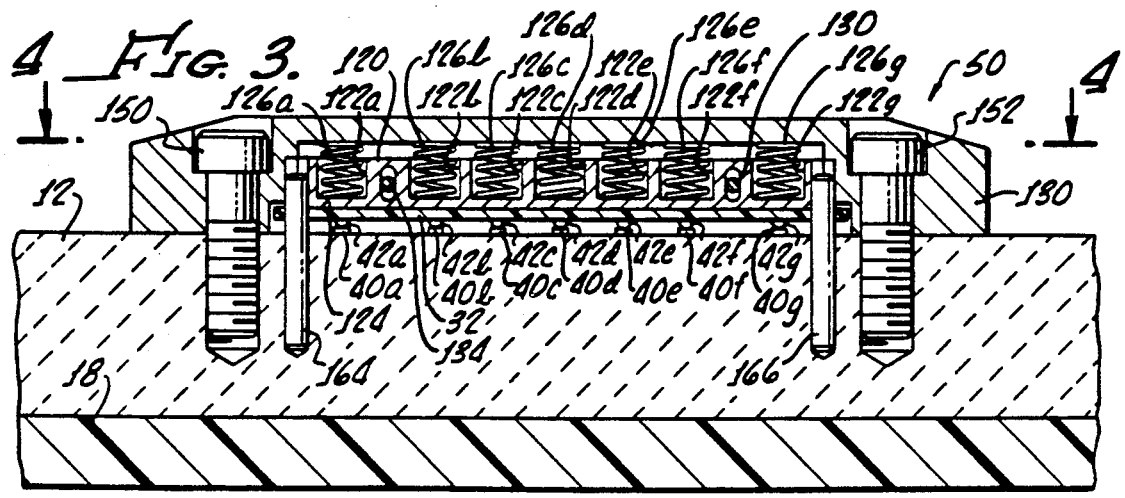
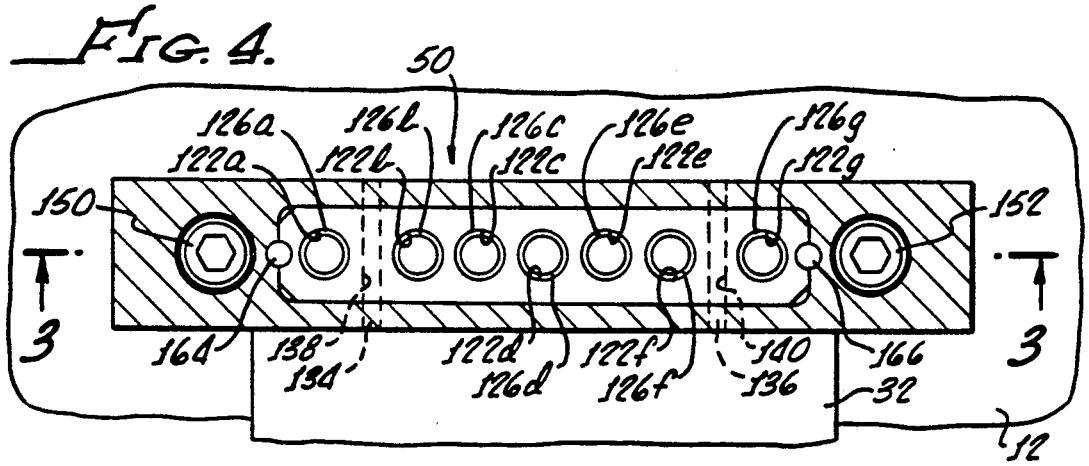

RAISED FEATURE/GOLD DOT PRESSURE INTERCONNECTIONS OF RIGID-FLEX CIRCUITS AND RIGID CIRCUIT BOARDS

BACKGROUND OF THE INVENTION

1. Field of the Invention

The present invention relates to circuit board interconnections, and more particularly concerns interconnections between rigid-flex circuits and circuit boards.

2. Description of Related Art

Electronic systems are frequently composed of circuitry formed on individual circuit boards, with the boards being electrically interconnected as required for operation of the electrical system. Frequently a plurality of circuit boards are mounted on an assembly base, and a multi-layer rigid-flex circuit, also mounted on the base, extends along or between rows of circuit boards that are to be interconnected. The rigid-flex circuit is then connected to each of the circuit boards by connectors or other types of circuit board interconnection devices. Such types of interconnections are laborious, time consuming, expensive to accomplish and subject to errors and mechanical failures.

Accordingly, it is an object of the present invention to provide for interconnection of a rigid-flex multi-layer circuit by means of an integral configuration that avoids or minimizes above mentioned problems.

SUMMARY OF THE INVENTION

In carrying out principles of the present invention in accordance with a preferred embodiment thereof, a rigid-flex multi-layer circuit is formed with a plurality of flexible layers each composed of a flexible substrate that bears a pattern of conductive traces. A rigid substrate is laminated together with all of the flexible layers. The flexible layers are individually provided with outwardly projecting integral connection arms, each formed of a single or multiple flexible layer, with each arm having a plurality of projecting features or gold dots arranged to be placed in pressure contact with contact pads on an associated one of the circuit boards, thus making electrical interconnects between the related assemblies.

BRIEF DESCRIPTION OF THE DRAWINGS

In the accompanying drawings:

FIG. 2 is a section showing layers of the multi-layer rigid-flex circuit and a pair of flex circuit connection arms extending therefrom;

FIG. 3 is a section illustrating details of the clamping bar; and

FIG. 4 is a top plan view of the clamping bar assembly.

DESCRIPTION OF THE PREFERRED EMBODIMENTS

Figure 1:
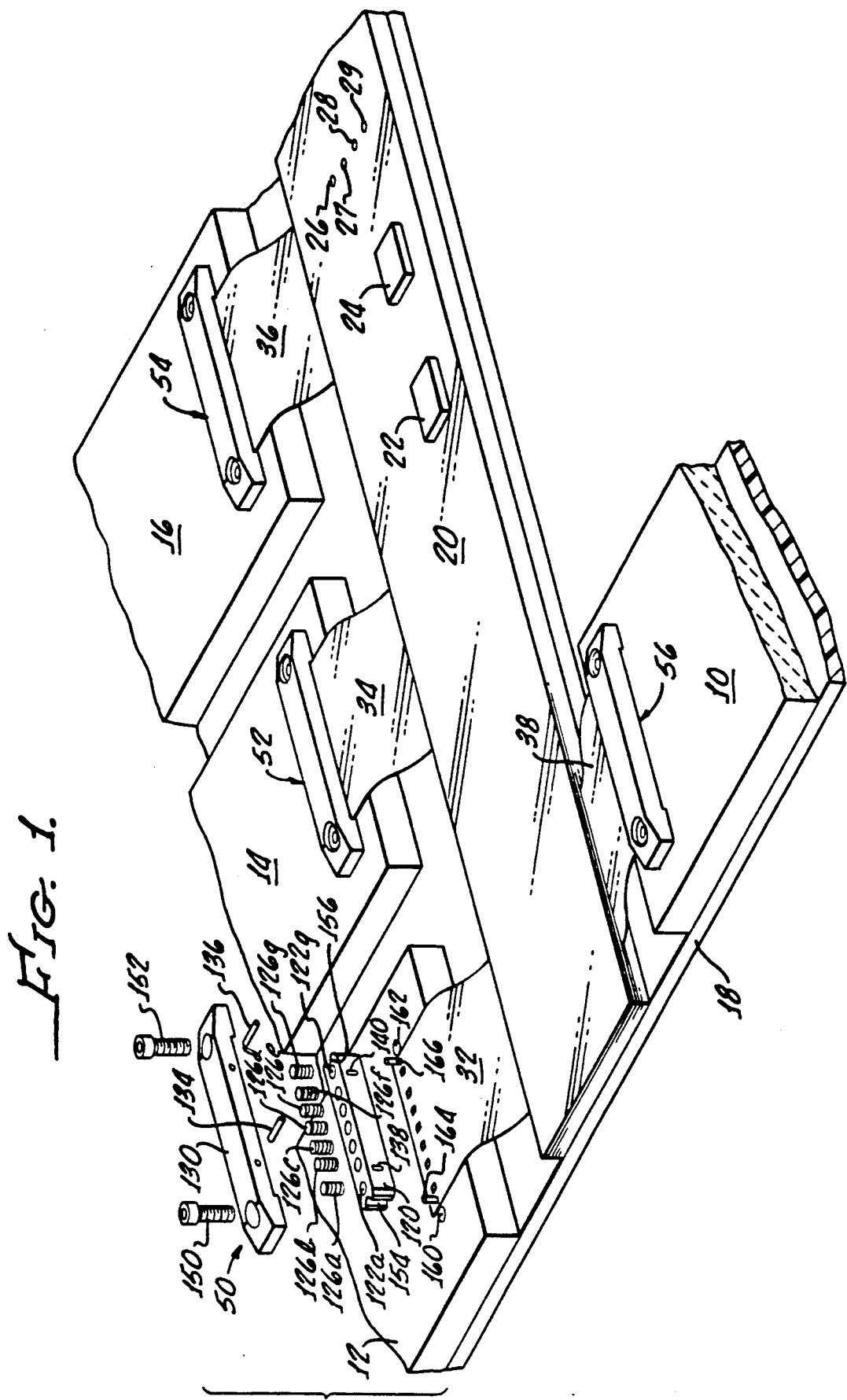
FIG. 1 is a pictorial illustration, with parts broken away, of portions of an assembly of ceramic circuit boards interconnected with a rigid-flex multi-layer circuit in a configuration embodying principles of the present invention.

As shown in FIG. I, a plurality of mutually spaced but adjacent printed circuit boards such as, for example, ceramic boards 10,12,14 and 16 are fixedly mounted upon an assembly base 18, together with other circuit boards or components (not shown). Various components (not shown) may be mounted on the circuit boards. To interconnect the circuit boards with one another and with other circuit boards of the assembly, and, in addition with various other components, there is provided a rigid-flex multi-layer circuit 20. If deemed necessary or desirable, circuit 20 may mount a plurality of surface mounted components, such as the exemplary components indicated at 22 and 24, which are connected to traces on different layers of said rigid-flex multi-layer circuit. A plurality of plated through-holes, particularly located for interconnection of various layers of the rigid-flex circuit but shown at 26,27,28 and 29 for purposes of illustration, extend through the multi-layer rigid-flex circuit for interconnection of various layers with one another.

The rigid flex circuit 20 is formed with a number of laterally outwardly projecting flexible integral connection arms 32,34,36,38 which extend from the main body section of the rigid-flex circuit 20 for connection to groups of circuit board contact pads such as 40a through 40f (see FIG. 3). The arms each extend beyond the outer periphery of the main body section of the rigid-flex multi-layer circuit. At the outer end of each of the connection arms 32 through 38 is formed a group of projecting features, also known as gold dots, that provide contact buttons which project outwardly from the plane of the circuitry of the flexible circuit arm. A group of these projecting features on arm 32 is designated as 42a through 42f in FIG. 3.

A clamping structure, shown in exploded form and generally designated as 50,52,54,56, for the respective arms, is bolted to each of the circuit boards to clamp an end of the flexible integral connection arm and its gold dot projection features to and against the circuit board contact pads. Importantly, each flexible connection arm is integral with a different layer of the multi-layer rigid-flex circuit and extends laterally therefrom to overlap a portion of an adjacent printed circuit board. Because the flexible integral connection arm includes no rigidifying substrate, is free to bend as required for optimum contact with the circuit board contact pads.

As shown in the fragmented transverse cross-section of FIG. 2, the multi-layer rigid-flex circuit 20 comprises a plurality of flexible circuit layers, indicated in FIG. 2 as flexible layers 60, 62, 64, 66, 68, 70 and 72, each insulated from an adjoining flexible circuit layer by an interposed layer of dielectric 80, 82, 84, 86, 88 and 90. The flexible circuit layers are stacked one upon the other and all are stacked upon a rigid substrate 100 (for example, a glass epoxy) and cured to form the unitary multi-layer rigid-flex circuit. Suitable adhesive may be provided between adjacent flexible circuit layers to hold the stack together. Each circuit layer 60, 62, 64, etc. is composed of a conventionally formed flexible circuit layer having a dielectric (such as polyimide) substrate on which is formed a pattern of electrically conductive traces. Any of many well known suitable arrangements for making such individual flexible circuit layers may be employed. For example, a double copper clad polyamide substrate may be used by forming a pattern of circuit traces thereon by means of conventional photolithographic etching processes. Alternatively, circuit traces and a dielectric substrate may be prepared on a mandrel, generally in the manner set out in U.S. Pat No. 5,207,887 for U.S. Ser. No. 07/753,400 for Semi- Additive Circuitry With Raised Features Using Formed Mandrels, issued May 4, 1993, by William R. Crumly, Christopher M. Schreiber and David B. Swarbrick.

Another alternative manner of forming a flexible circuit is disclosed in U.S. Pat. No. 5,197,184 for Three-Dimensional Electroformed Circuitry, filed Sep. 11, 1990 issued Mar. 30, 1993, by William R. Crumly, Christopher M. Schreiber and Haim Feigenbaum. Both of these applications are assigned to the assignee of the present application. The disclosures of these prior applications are incorporated by reference as though fully set forth herein.

In forming the multi-layer rigid-flex circuit, all of the circuit layers and the rigid substrate have a configuration that defines a common footprint or horizontal area (as viewed in FIG. 2), except for the fact that different ones of individual flexible layers have integrally formed connection arms that are located at different positions, as in FIG. 1. Because each of the connection arms is integral with a different one of the layers of the rigid-flex circuit 20, the arms project from the sides of the rigid-flex layer at different levels relative to its rigid substrate 100. Each of the arms, at an area adjacent an end thereof, is formed with a pattern of projecting features or gold dot contact buttons, indicated at 42a through 42f in FIG. 3. The pattern of projecting features is congruent with the pattern of circuit board contact pads 40a through 40f. The projecting features are pressed downwardly against the board contact pads by the individual clamping structures.

As mentioned above, each layer of the multi-layer rigid-flex circuit includes a flexible dielectric substrate, such as an epoxy or a polyimide, and a pattern of flexible conductive traces. This flexible dielectric substrate and conductive traces, such as trace 110 on connection arm 32 of FIG. 2, extends from circuit traces within the main body of the multi-layer rigid-flex circuit along the flexible connection arm for electrical connection with a respective one of the individual gold dots or projecting features formed at the end of the flexible connection arm.

The projecting features may be formed by additive plating on selected areas of the circuit traces, as described for example in U.S. Pat. No. 4,453,795, for Cable-To-Cable/Component Electrical Pressure Wafer Connector Assembly and U.S. Pat. No. 4,125,310 for Electrical Connector Assembly Utilizing Wafers For Connecting Electrical Cables. Alternatively, these projecting features may be formed on a mandrel as described in the above-identified pending patent applications. In the processes described in these applications, a mandrel is provided which includes a flat surface in which is formed a depression or recess which has a contour complementary to that of a raised feature to be produced. A flash copper plating is applied over the mandrel surface, including the surface of the recess. After this a photoresist, which is the negative of a circuit to be produced, is applied over the flash copper plating, and copper is electroplated into the spaces in the photoresist to result in an electrical circuit, namely the conductive traces and projecting features. The resist is then removed, a dielectric layer is laminated over the copper, and the assembly is separated from the mandrel. The flash copper layer is then etched away to leave a completed flexible circuit on the flexible dielectric substrate, to form a single layer that will be stacked with other similarly formed layers.

The several clamping structures, 50,52,54,56 are identical to each other, and each includes an elongated pressure bar 120 having a plurality of blind holes 122a through 122g, each of which extends from a bottom plate 124 of the pressure bar to open upwardly at the upper surface of the pressure bar and receives an individual one of a group of compressions springs 126a through 126g. The springs are compressed between the pressure bar bottom 124 and a pressure bar housing 130, which includes a downwardly extending recess that receives the pressure bar. A pair of horizontally directed dowel pins 134,136 extend through the housing and through vertically elongated holes 138,140 (see FIG. 1) in the pressure bar to hold the clamp assembly components in assembled condition, with the springs 126a through 126g compressed between the bottom 124 of the pressure bar and the housing 130.

A pair of holes on opposite ends of the housing receive bolts 150,152, having threaded shanks extending through U-shaped recesses 154,156 on the ends of the pressure bar and into threaded engagement in holes 160,162 formed in the upper surface of the circuit board 12. The end of the flexible integrated connection arm 32 at either side is apertured, as at 164,166, to receive vertical alignment pins that extend into alignment holes adjacent the pattern of circuit board contact pads.

To complete the connection of the rigid-flex circuit 20 to a circuit board 12, the flexible integrated connection arm 32 is bent to position its end, which bears the projecting features, over the circuit board contact pads, and alignment pins are inserted through the alignment holes in the ends of the flexible circuit into mating alignment holes (not shown) in the circuit board. This properly positions the end of the flexible circuit arm over the contact pads of the circuit board to ensure that there is proper alignment of the projecting features with the circuit board contact pads. The clamping assembly is then positioned over the upper surface of the end of the flexible circuit arm 32, and bolts 150,152 inserted into and tightened in the circuit board apertures to urge the pressure bar, and thereby the end of the flexible integrated connection arm, downwardly against the circuit board, to thereby press the projecting features against the circuit board contact pads.

The plurality of springs pressing down against the bottom the clamping bar ensure a planarized firm contact of each of the individual projection features of the flexible connection arm with an individual one of the circuit board contact pads. If deemed necessary or desirable, an additional planarizing element in the form of an elastomeric pad (not shown) may be interposed between the bottom of the clamp bar and the upper side of the integral flexible connection arm 32.

It will be readily understood that the number of layers of the rigid-flex circuit and the number of individual laterally projecting integral flexible connection arms thereof is shown in the drawing solely for purposes of exposition, since the rigid-flex circuit may have any reasonable number desired of circuit layers and any one or more of such layers may have its own integral flexible connection arm. In some situations one layer may also have more than one arm, where two arms from the same layer are preferably, but not necessarily, arranged to project in laterally opposite directions from the rigid-flex circuit. Any one arm may be formed of one or more layers.

Signals are routed through the circuit layers of the rigid-flex circuit by any one of various well known technologies, including plated through-holes and surface mounted components.

There has been described an improved arrangement for interconnecting ceramic circuit boards and rigid-flex multi-layer circuits employing flexible connection arms bearing gold dot projection features that are clamped against individual mating patterns of circuit board contact pads.

What is claimed is:

1. A rigid-flex multi-layer circuit and connection assembly comprising:
   a plurality of flexible layers each formed of a flexible dielectric and a pattern of conductive traces thereon,
   a rigid substrate,
   said layers and substrate being laminated together to form said multi-layer circuit,
   one of said flexible layers having an integral connection arm that projects outwardly from said multi-layer circuit, and
   a plurality of projecting contact features on said integral connection arm, each said contact feature being connected to on of said conductive traces on said one flexible layer.

2. The assembly of claim 1 wherein said rigid-flex multi-layer circuit including said rigid substrate is bounded by a circuit periphery, and wherein said integral connection arm extends beyond said periphery.

3. The assembly of claim 1 including a plurality of alignment holes formed in an end of said arm adjacent said contact features.

4. The assembly of claim 1 wherein a second one of said layers, other than said one layer, has a second integral connection arm that projects outwardly from said multi-layer circuit, and a second plurality of projecting contact features on said second arm, each contact of said second plurality of projecting contacts being connected to a conductive trace on said second one of said layers.

5. The assembly of claim 1 including a circuit board having a plurality of board contact pads, said projecting contact features being pressed against respective ones of said board contact pads, and clamping means for clamping said integral connection arm to said circuit board to press said projecting contact features against said board contact pads.

6. The assembly of claim 5 wherein said clamping means comprises a pressure bar extending across said integral connection arm, a housing receiving said pressure bar, and means for urging said housing and pressure bar toward said circuit board to urge said projecting contact features against said board contact pads.

7. The assembly of claim 6 wherein said pressure bar includes a bottom and a plurality of blind holes ending at said bottom, and a plurality of springs in respective ones of said blind holes compressed between said housing and said bottom.

8. A rigid-flex circuit assembly comprising:
   a rigid-flex multi-layer circuit including:
      a plurality of flexible layers each formed of a flexible dielectric and a pattern of conductive traces thereon, and
      a rigid substrate,
      said layers and substrate being laminated together to form said multi-layer circuit,
   a plurality of circuit boards having contact pads, and connection means for connecting said circuit boards with said rigid-flex multi-layer circuit, said connection means comprising:
      a plurality of connection arms, each being integral with a different one of said flexible layers and each defining a flexible connection arm that projects outwardly from said multi-layer circuit,
      a plurality of projecting contact features on each of said integral connection arms, each said contact feature of each arm being connected to a conductive trace on the associated one of said flexible layers, each said arm individually extending from said rigid-flex multi-layer circuit to a respective one of said circuit boards, and
      means for electrically connecting the projecting contact features of each arm to a respective one of said circuit boards.

9. The apparatus of claim 8 wherein each said circuit board comprises a rigid substrate, electrical circuitry on said circuit board substrate, said means for electrically connecting comprising a plurality of board contact pads on said substrate in connection with said electrical circuitry, the projecting contact features on one of said integral flexible connection arms being in contact with respective ones of said board contact pads of one of said boards, and means for pressing the projecting features of said one flexible integral connection arm against said board contact pads of said one board.

10. The apparatus of claim 8 wherein each of said integral connection arms is integral with a different one of said flexible layers of said rigid-flex multi-layer circuit.

11. The apparatus of claim 8 wherein at least one of said circuit boards is laterally spaced from said rigid-flex multi-layer circuit to define a space therebetween, and wherein one of said integral flexible connection arms bridges the space between said rigid-flex multi-layer circuit and said one circuit board.

12. The apparatus of claim 9 wherein said means for pressing comprises clamping means for firmly urging the projecting contact features of one of said integral flexible connection arms against the board contact pads of said one circuit board.

13. The apparatus of claim 12 wherein said clamping means comprises a pressure bar extending across said one integral flexible connection arm, a housing receiving said pressure bar, and fastening means for urging said housing and pressure bar toward said one circuit board to urge said projecting contact features of said one integral connection arm against the board contact pads of said one circuit board.

14. The apparatus of claim 13 wherein said pressure bar includes a bottom and a plurality of blind holes ending at said bottom, and a plurality of springs in respective ones of said blind holes and compressed between said housing and said bottom.

15. The apparatus of claim 14 including a plurality of surface mounted components mounted on said rigid-flex multi-layer circuit and connected to traces on at least some of said plurality of flexible layers.

16. In combination:
   a plurality of flexible circuit layers,
   a rigid substrate laminated to all of said circuit layers to form a rigid-flex circuit,
   a plurality of rigid circuit boards adjacent said rigid-flex circuit, and
   a plurality of connection arms connecting different ones of said flexible circuit layers with a respective one of said rigid circuit boards,
   each said connection arm comprising:
      a flexible circuit arm integral with and projecting laterally from an individual one of said flexible circuit layers,
      a plurality of gold dot projection features on an end portion of said flexible circuit arm, and
      means for pressing said gold dot projection features against an associated one of said circuit boards.

* * * * *